United States Patent
Chen

(10) Patent No.: US 7,709,913 B2
(45) Date of Patent: May 4, 2010

(54) IMAGE SENSOR PACKAGE AND PACKAGING METHOD FOR THE SAME

(75) Inventor: Jian Cheng Chen, Tainan County (TW)

(73) Assignee: Advanced Semiconductor Engineering Inc., Pingtung, Pingtung County (TW)

( * ) Notice: Subject to any disclaimer, the term of this patent is extended or adjusted under 35 U.S.C. 154(b) by 146 days.

(21) Appl. No.: 12/038,914

(22) Filed: Feb. 28, 2008

(65) Prior Publication Data

US 2008/0303106 A1 Dec. 11, 2008

(30) Foreign Application Priority Data

Jun. 8, 2007 (TW) .............................. 96120666 A

(51) Int. Cl.
*H01L 31/0203* (2006.01)
*H01L 31/18* (2006.01)

(52) U.S. Cl. .................. 257/432; 257/433; 257/234; 257/E31.127; 438/65; 438/75

(58) Field of Classification Search ................. 257/432, 257/234, 414, 419, 433, 434, 435, E31.127, 257/E21.611, E27.13, E27.133, E27.15, E27.153, 257/E27.154, E27.159; 438/60, 65, 75
See application file for complete search history.

(56) References Cited

FOREIGN PATENT DOCUMENTS

| JP | 61134187 A | 6/1986 |
|----|------------|--------|
| JP | 09232548 A | 9/1997 |

*Primary Examiner*—Victor A Mandala
*Assistant Examiner*—Whitney Moore

(57) ABSTRACT

An image sensor package includes a substrate, a sensor chip, a frame, a lens element and at least a pair of guide pins. The sensor chip is mounted on the substrate, and has two opposite sides and a sensing region, which has a sensing region central axis. The frame is mounted on the substrate, and has an aperture and an inner space with the sensor chip disposed therein. The lens element is disposed inside the aperture and has a lens central axis. The guide pins locate oppositely inside the inner space of the frame with an interval between the tips of the guide pins substantially identical to the distance between the opposite sides of the sensor chip, wherein the central line of the interval between the tips of the guide pins defines a positioning line, which substantially coincides with the lens central axis; wherein the tip of each guide pin is aligned with one of the opposite sides of the sensor chip such that the positioning line is substantially coincided with the sensing region central axis.

13 Claims, 2 Drawing Sheets

IMAGE SENSOR PACKAGE AND PACKAGING METHOD FOR THE SAME

CROSS REFERENCE TO RELATED APPLICATION

This application claims the priority benefit of Taiwan Patent Application Serial Number 096120666, filed on Jun. 8, 2007, the full disclosure of which is incorporated herein by reference.

BACKGROUND OF THE INVENTION

1. Field of the Invention

This invention generally relates to a semiconductor package and packaging method thereof, and more particularly, to an image sensor package and a packaging method for the same.

2. Description of the Related Art

In a conventional solid-state image device, as disclosed in Japanese patent publication number 61-134187 and entitled "Solid-State Image Pickup Device" as shown in FIG. 1, a CCD image sensing chip 303 is attached to a substrate 301 by means of an adhesive 302 and the substrate 301 has erected side walls 305 at its surroundings. A frame 307 for carrying a lens element 308 is fixed on the side walls 305 by means of an adhesive 306. However, in an actual packaging process, when the CCD image sensing chip 303 is attached to the substrate 301 by means of the adhesive 302, a positional error of the CCD image sensing chip 303 may be introduced such that the central axis 303c of the chip 303 may deviate from a predetermined central line 300c, i.e. de-center caused by the die attachment process. In addition, when fixing the frame 307 with the adhesive 306, a second positional error may be introduced such that the central axis 308c of the lens element 308 may deviate from the predetermined central line 300c to cause further de-center. In the solid-state image device 300, the positional deviation between the central axis 303c of the CCD image sensing chip 303 and the central axis 308c of the lens element 308 is preferably controlled within 20 micrometers such that the imaging beams from the lens element 308 can fall onto the effective sensing region of the CCD image sensing chip 303 and the captured image can be fully displayed without the shading phenomenon.

In order to solve the aforementioned misalignment problem, many methods have been provided in the art to decrease the occurrence of de-center, as disclosed in Japanese patent publication number 9-232548 and entitled "Solid-State Image Pickup Device" as shown in FIG. 2. In this reference, a plurality of stepped positioning portions 4, 5 and 6 are formed on a single supporting member 2 and then a solid-state image device 7, a lens element 8 and a diaphragm plate 9 are sequentially mounted on those positioning portions so as to improve positioning accuracy during packaging and decrease the occurrence of de-center. However, in an actual packaging process, manufacturing errors still exist for the positioning portions 4 of the solid-state image device 7 and the positioning portions 5 of the lens element 8. The accumulations of the manufacturing errors of the positioning portions 4 and 5 can still affect positioning accuracies of each element and introduce de-center. In addition, in this solid-state image pickup device, the supporting member 2 is directly formed on the leadframe 3 and thus the device is only applicable to a solid-state image device with a low pin count. As to a solid-state image device with a high pin count, the leadframe 3 cannot fulfill its requirement and therefore it is necessary to use the chip on board (COB) package. However, the supporting member 2 of the solid-state image device cannot be formed directly on the substrate.

According to the above reasons, it is necessary to further improve the above mentioned solid-state image device so as to solve the problem of positional deviation between the lens element and the chip in a COB-type image sensor package.

SUMMARY OF THE INVENTION

It is an object of the present invention to provide an image sensor package and a packaging method for the same to solve the problem of positional deviation between the sensing region of a sensor chip and the lens element.

In order to achieve the above object, the image sensor package according to the present invention mainly includes a substrate, a sensor chip, a frame, a lens element, and at least a pair of guide pins. The sensor chip is mounted on the substrate, and has two opposite sides and a sensing region, which has a sensing region central axis. The frame is mounted on the substrate, and has an aperture and an inner space with the sensor chip disposed therein. The lens element is disposed inside the aperture and has a lens central axis. The guide pins locate oppositely inside the inner space of the frame with an interval between the tips of the guide pins substantially identical to the distance between the opposite sides of the sensor chip, wherein the central line of the interval between the tips of the guide pins defines a positioning line, which is substantially coincided with the lens central axis; wherein the tip of each guide pin is aligned with one of the opposite sides of the sensor chip respectively such that the positioning line is substantially coincided with the sensing region central axis.

The present invention also provides a packaging method for an image sensor package. The image sensor package includes a sensor chip, a frame, a lens element and at least a pair of guide pins, wherein the sensor chip has two opposite sides and a sensing region, which has a sensing region central axis; the frame has an inner space and an aperture for carrying the lens element, which has a lens central axis; the guide pins are located oppositely inside the inner space of the frame with an interval between the tips of the guide pins substantially identical to the distance between the opposite sides of the sensor chip; wherein the central line of the interval between the tips of the guide pins defines a positioning line, which is substantially coincided with the lens central axis. The packaging method includes the steps of: mounting the sensor chip on the substrate; mounting the frame on the substrate such that the sensor chip is disposed inside the inner space; and aligning the tip of each guide pin with one of the opposite sides of the sensor chip such that the positioning line is substantially coincided with the sensing region central axis.

In the image sensor package of the present invention, the lens central axis of the lens element carried by the frame is substantially coincided with the sensing region central axis of the sensor chip by forming at least one pair of guide pins inside the frame. Accordingly, the positional deviation between the sensing region of the sensor chip and the lens element can be decreased so as to improve the positioning accuracy in packaging.

According to the image sensor package of the present invention, the guide pins are formed integrally inside the frame by means of injection molding without increasing the manufacturing complexity.

BRIEF DESCRIPTION OF THE DRAWINGS

Other objects, advantages, and novel features of the present invention will become more apparent from the following detailed description when taken in conjunction with the accompanying drawings.

FIG. 3b shows a sectional view taken along the line 3b-3b of FIG. 3a.

DETAILED DESCRIPTION OF THE PREFERRED EMBODIMENT

Figure 3A:
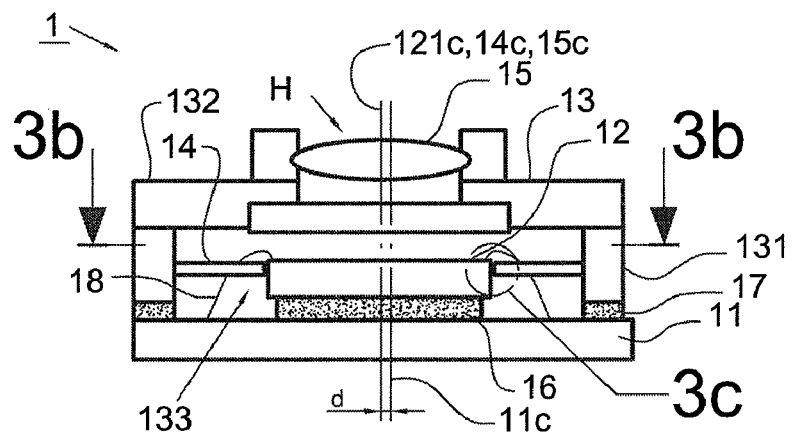
FIG. 3a shows a sectional view of an image sensor package according to one embodiment of the present invention.
Figure 3B:
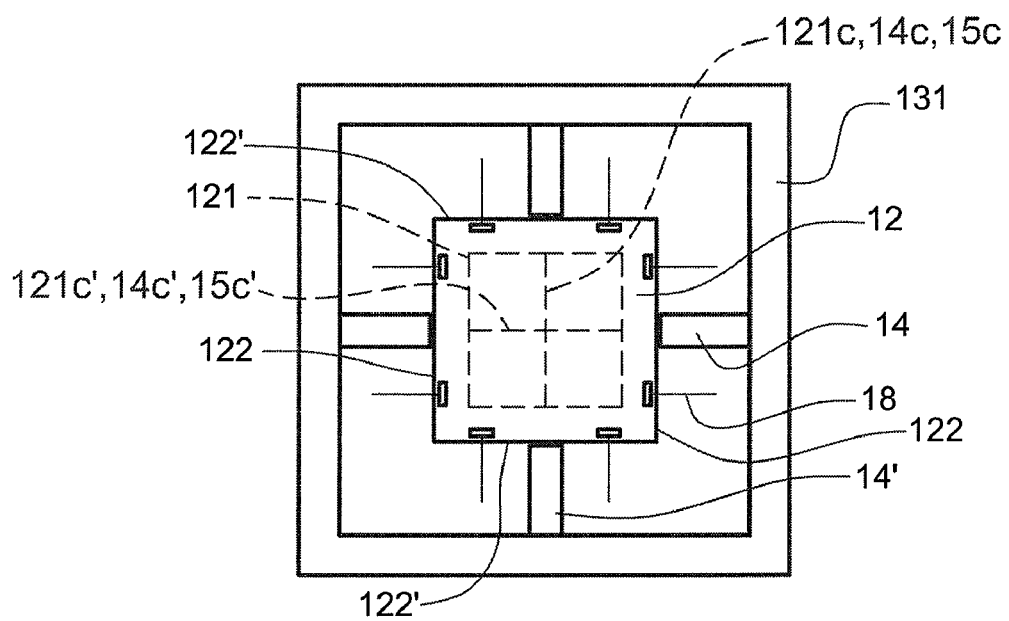

Referring to FIGS. 3a and 3b, FIG. 3a illustrates a sectional view of the image sensor package 1 according to one embodiment of the present invention and FIG. 3b shows a sectional view taken along the line 3b-3b of FIG. 3a. The image sensor package 1 includes a substrate 11, a sensor chip 12, a frame 13, at least a pair of first guide pins 14 and a lens element 15, and all these elements together form the image sensor package 1 of the present invention. Imaging beams are incident from outside of the image sensor package 1 to penetrate the lens element 15 and are then captured by an image sensing region 121 of the sensor chip 12.

Embodiments of the substrate 11 may be a printed circuit board or a ceramic circuit board, and the substrate 11 has a predetermined packaging line 11c served as a datum line for packaging the sensor chip 12 and the frame 13 thereon. Embodiments of the sensor chip 12 may be a Complementary Metal-Oxide-Semiconductor (CMOS) image sensing chip, a Charge Coupled Device (CCD) image sensing chip, or other kinds of image sensing chip for capturing images. The sensor chip 12 has two first opposite sides 122, 122 and a sensing region 121, which has a first sensing region central axis 121c. The frame 13 is mounted over the sensor chip 12 and includes an upper frame 132 and a side wall 131. The middle of the upper frame 132 has an aperture H for carrying the lens element 15, which has a first lens central axis 15c. The side wall 131 is erected from the edges of the frame 13 and thus an inner space 133 is formed inside the frame 13, and the sensor chip 12 is disposed inside the inner space 133. The frame 13 and the lens element 15 are, preferably, sealed hermetically so as to prevent dust from entering the image sensor package 1 and affecting the performance of the package. At least one pair of first guide pins 14 are formed on the side wall 131 inside the inner space 133 and are preferably formed integrally thereon by means of injection molding. The interval between the tips of the first guide pins 14 is substantially identical to or larger than, by a range from 1 to 2 micrometers, the distance between the first opposite sides 122 of the sensor chip 12. The central line of the interval between the tips of the first guide pins 14 defines a first positioning line 14c, which substantially coincides with the first lens central axis 15c; meaning that, the lens element 15 is aligned with the interval between the tips of the first guide pins 14. During packaging, the sensor chip 12 is inserted between the first guide pins 14 and the tips of the first guide pins 14 are aligned with the first opposite sides 122 of the sensor chip 12 such that the first sensing region central axis 121c of the sensor chip 12 is substantially coincided with the first positioning line 14c. In this manner, the first sensing region central axis 121c is substantially coincided with the first lens central axis 15c so as to eliminate the positional deviation between the sensing region 121 of the sensor chip 12 and the lens element 15.

The packaging method for the image sensor package 1 of the present invention is illustrated hereinafter. First, the sensor chip 12 is attached to the substrate 11 and preferably it is die attached to the substrate 11 by means of an adhesive 16. Then, the sensor chip 12 is connected to the substrate 11 through a plurality of bonding wires 18, e.g. gold wires, so as to electrically connect to the leadframe (not shown). After the sensor chip 12 goes through the die attachment and wire bonding processes, a positional deviation "d" tends to form between the first sensing region central axis 121c and the predetermined packaging line 11c. Then, the frame 13, which carries the lens element 15, is mounted over the sensor chip 12 such that the sensor chip 12 is located inside the inner space 133. After the tips of the first guide pins 14 are aligned with the first opposite sides 122 of the sensor chip 12, the bottom of the side wall 131 of the frame 13 is attached to the substrate 11 by means of an adhesive 17 or the like. Alternatively, the frame 13 can be riveted to the substrate 11 by disposing rivets (not shown) on the bottom of the side wall 131 and inserting the rivets into the substrate 11. Accordingly, although a first positional deviation "d" may be formed between the first sensing region central axis 121c of the sensor chip 12 and the predetermined packaging line 11c after the sensor chip 12 is die attached and wire bonded, a second positional deviation is not formed between the first lens central axis 15c of the lens element 15 and the first sensing region central axis 121c of the sensor chip 12 by utilizing the frame 13 of the present invention. This is because the packaging of the frame 13 is positioned with reference to the first sensing region central axis 121c of the sensor chip 12. The sensing region 121 of the sensor chip 12 is indeed aligned to the lens element 15, thereby improving the positioning accuracy.

In an alternative embodiment, two pairs of guide pins, e.g. first guide pins 14 and second guide pins 14', are disposed at different locations inside the frame 13; for example in this embodiment, the guide pins 14 and 14' are perpendicular to each other; wherein the first positioning line 14c defined by the central line of the interval between the tips of the first guide pins 14 is substantially coincided with a first lens central axis 15c of the lens element 15, and a second positioning line 14c' defined by the central line of the interval between the tips of the second guide pins 14' is substantially coincided with a second lens central axis 15c' of the lens element 15. The sensor chip 12 has a first sensing region central axis 12c parallel to its first opposite sides 122 and a second sensing region central axis 12c' parallel to its second opposite sides 122'. During packaging, the tips of the first guide pins 14 are aligned with the first opposite sides 122 of the sensor chip 12 such that the first sensing region central axis 121c can be substantially coincided with the first lens central axis 15c while the tips of the second guide pins 14' are aligned with the second opposite sides 122' of the sensor chip 12 such that the second sensing region central axis 121c' can be substantially coincided with the second lens central axis 15c'. In this manner, positional deviations between the lens element 15 and the sensing region 121 of the sensor chip 12 in different directions can be further decreased.

Figure 3C:
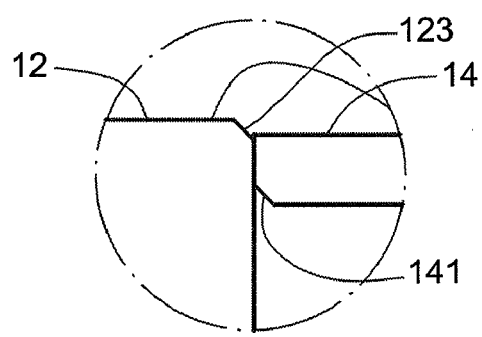
FIG. 3c shows an enlarged view of the alignment between the sensor chip and one guide pin.

Referring to FIG. 3c, it shows an enlarged view of the alignment of the sensor chip 12 and one of the first guide pins 14. In order to facilitate the alignment between the first guide pins 14 of the frame 13 and the first opposite sides 122 of the sensor chip 12, it is preferable to form lead angles 141 on the tips of the first guide pins 14, lead angles 123 on the sides of the sensor chip 12, or lead angles on both the tips of the first guide pins 14 and the sides of the sensor chip 12.

Figure 1:
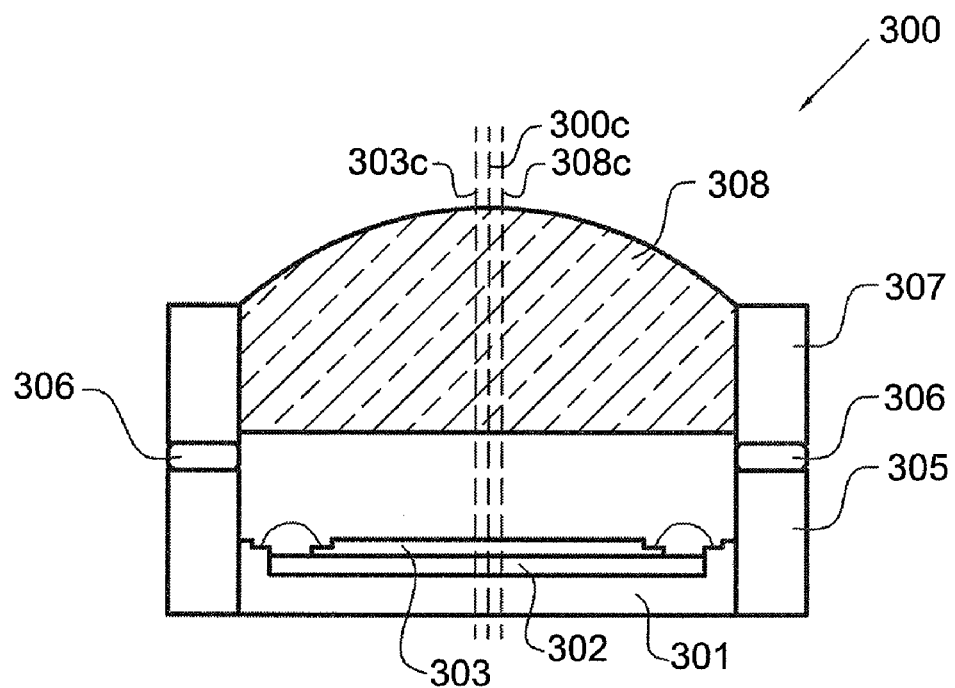
FIG. 1 shows a sectional view of a conventional solid-state image device.
Figure 2:
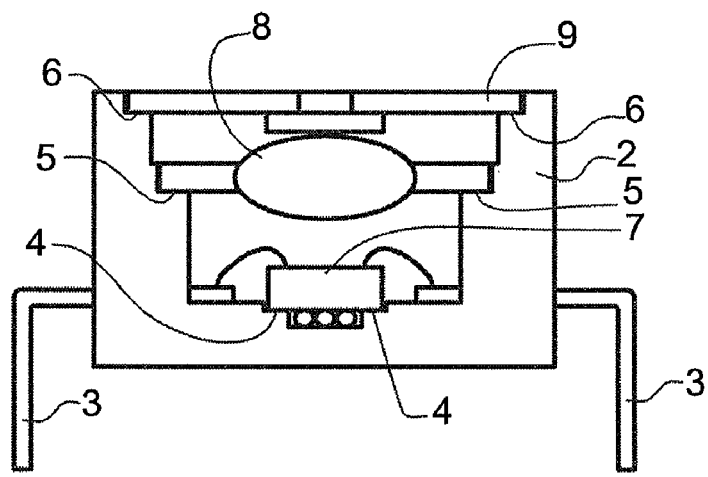
FIG. 2 shows a sectional view of another conventional solid-state image device.

As described above, since conventional solid-state image devices shown in FIGS. 1 and 2 have the problem of low positioning accuracy, it will decrease the yield of packaging. Compared with the conventional solid-state image devices shown in FIGS. 1 and 2, the image sensor package 1 and packaging method for the same (shown in FIGS. 3a and 3b) according to the present invention can indeed improve the positioning accuracy during packaging by means of forming at least one pair of guide pins 14 inside the frame 13. And because the guide pins 14 can be formed integrally on the frame 13 by means of injection molding, the manufacturing complexity will not be increased.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. An image sensor package, comprising:
   a substrate;
   a sensor chip, mounted on the substrate, having two opposite sides and a sensing region, which has a sensing region central axis;
   a frame, mounted on the substrate, having an aperture and an inner space with the sensor chip disposed therein;
   a lens element, disposed inside the aperture and having a lens central axis; and
   at least a pair of guide pins located oppositely inside the inner space of the frame with an interval between the tips of the guide pins substantially identical to the distance between the opposite sides of the sensor chip, wherein the central line of the interval between the tips of the guide pins defines a positioning line, which is substantially coincided with the lens central axis;
   wherein the tip of each guide pin is aligned with one of the opposite sides of the sensor chip such that the positioning line is substantially coincided with the sensing region central axis.

2. The image sensor package as claimed in claim 1, wherein the sensor chip is attached to the substrate by means of adhesive.

3. The image sensor package as claimed in claim 1, wherein the side wall of the frame is attached to the substrate by means of adhesive.

4. The image sensor package as claimed in claim 1, wherein the guide pins are formed integrally with the frame by means of injection molding.

5. The image sensor package as claimed in claim 1, wherein the sensor chip is a CMOS image sensing chip or a CCD image sensing chip.

6. The image sensor package as claimed in claim 1, further comprising a plurality of bonding wires electrically connected between the sensor chip and the substrate.

7. The image sensor package as claimed in claim 1, wherein the tips of the guide pins comprise a lead angle.

8. The image sensor package as claimed in claim 1, wherein the opposite sides of the sensor chip comprise a lead angle.

9. A packaging method for an image sensor package, the image sensor package comprising a sensor chip, a frame, a lens element and at least a pair of guide pins, the sensor chip having two opposite sides and a sensing region, which has a sensing region central axis; the frame having an inner space and an aperture for carrying the lens element, which has a lens central axis; the guide pins located oppositely inside the inner space of the frame with an interval between the tips of the guide pins substantially identical to the distance between the opposite sides of the sensor chip; the central line of the interval between the tips of the guide pins defining a positioning line, which is substantially coincided with the lens central axis, the packaging method comprising the steps of:
   mounting the sensor chip on the substrate;
   mounting the frame on the substrate such that the sensor chip is disposed inside the inner space;
   aligning the tip of each guide pin with one of the opposite sides of the sensor chip such that the positioning line is substantially coincided with the sensing region central axis.

10. The packaging method as claimed in claim 9, wherein the sensor chip is attached to the substrate by means of adhesive.

11. The packaging method as claimed in claim 9, wherein the frame is attached to the substrate by means of adhesive.

12. The packaging method as claimed in claim 9, wherein the sensor chip is a CMOS image sensing chip or a CCD image sensing chip.

13. The packaging method as claimed in claim 9, further comprising:
   electrically connecting the sensor chip and the substrate by means of a plurality of bonding wires.

* * * * *